United States Patent [19]

Chen et al.

[11] Patent Number: 5,726,573

[45] Date of Patent: Mar. 10, 1998

[54] TEST CIRCUIT FOR BACK-UP BATTERY WITH PROTECTION DURING TEST MODE

[75] Inventors: Zhong Xi Chen, Shrewsbury, Mass.; Thomas Thai Do, San Jose, Calif.

[73] Assignee: International Business Machines Corporation, Armonk, N.Y.

[21] Appl. No.: 529,122

[22] Filed: Sep. 15, 1995

(Under 37 CFR 1.47)

[51] Int. Cl.⁶ .................................................. H01M 10/44
[52] U.S. Cl. ............................ 324/429; 324/433; 320/48; 340/636
[58] Field of Search .......................... 340/636; 320/48, 320/45, 21; 324/429, 433

[56] References Cited

U.S. PATENT DOCUMENTS

| | | |
|---|---|---|
| 4,225,792 | 9/1980 | Fahey . |
| 4,316,133 | 2/1982 | Locke . |
| 4,354,118 | 10/1982 | Spencer . |
| 4,563,628 | 1/1986 | Tietz et al. . |
| 4,972,181 | 11/1990 | Fiene ..................................... 340/636 |
| 5,057,697 | 10/1991 | Hammond et al. . |
| 5,126,585 | 6/1992 | Boys . |
| 5,422,559 | 6/1995 | Hall ............................................. 320/21 |
| 5,528,149 | 6/1996 | Chen ......................................... 324/433 |

*Primary Examiner*—Ernest F. Karlsen
*Assistant Examiner*—Jose M. Solis
*Attorney, Agent, or Firm*—Arthur J. Samodovitz

[57] ABSTRACT

A circuit tests a back-up battery for a power supply. A power source is coupled to a load to deliver power at a normal rated voltage during normal operation. However, during a battery test interval, the power source voltage is lowered to a test mode voltage. This lowers the load voltage, and in response, the circuit attempts to supply the load from the battery. The load voltage is monitored during the test interval to determine if the battery is able to supply rated power. However, the main power source is still instantly available at the test mode voltage to drive the load if the battery fails during the battery test interval. This ensures uninterrupted operation during the test mode. Upon failure of the battery during the test mode, the power supply is quickly ramped up to the normal rated voltage (although the test mode voltage meets output specifications).

20 Claims, 4 Drawing Sheets

TEST CIRCUIT FOR BACK-UP BATTERY WITH PROTECTION DURING TEST MODE

BACKGROUND OF THE INVENTION

The invention relates generally to power circuits and deals more particularly with circuitry to test a battery which backs-up a main power source.

In critical applications requiring electrical power, a battery may be provided to back-up a main power source in the event that the main power source fails. For such applications it is important to periodically test the battery to ensure that the battery can still provide the requisite power if needed. To provide the test, it was known to periodically connect the battery to a dummy load and check that the battery can supply the requisite current and voltage for a predetermined time interval. (Then the battery is recharged from the main power source.) However, this approach requires a dummy load and dissipates extra power during the test.

Accordingly, a general object of the present invention is to provide circuitry to test a back-up battery without requiring a dummy load or dissipating extra power during the test.

Another object of the present invention is to provide circuitry of the foregoing type which reliably supplies the load during the test period.

SUMMARY OF THE INVENTION

The invention resides in the following circuit to test a back-up battery for a power source. The power source is coupled to a load to deliver power at a normal rated voltage during normal operation. However, during a battery test interval, the power source voltage is lowered to a test mode voltage. This lowers the load voltage below a predetermined level, although the main power source at the test mode voltage is still sufficient to drive the load.

The load voltage is monitored by a comparison to a reference voltage, and in response to the voltage drop, the circuit attempts to supply the load from the battery instead of the main power source. The load voltage continues to be monitored during the test interval to determine if the battery is able to supply rated power. However, the main power source is instantly available at the test mode voltage to drive the load if the battery fails during the battery test interval. This ensures uninterrupted operation during the test mode and does not require a dummy load.

If the battery fails the test mode, the power supply is quickly ramped up to the normal rated voltage (although the test mode voltage meets output specifications).

DETAILED DESCRIPTION OF THE PREFERRED EMBODIMENTS

Figure 1:
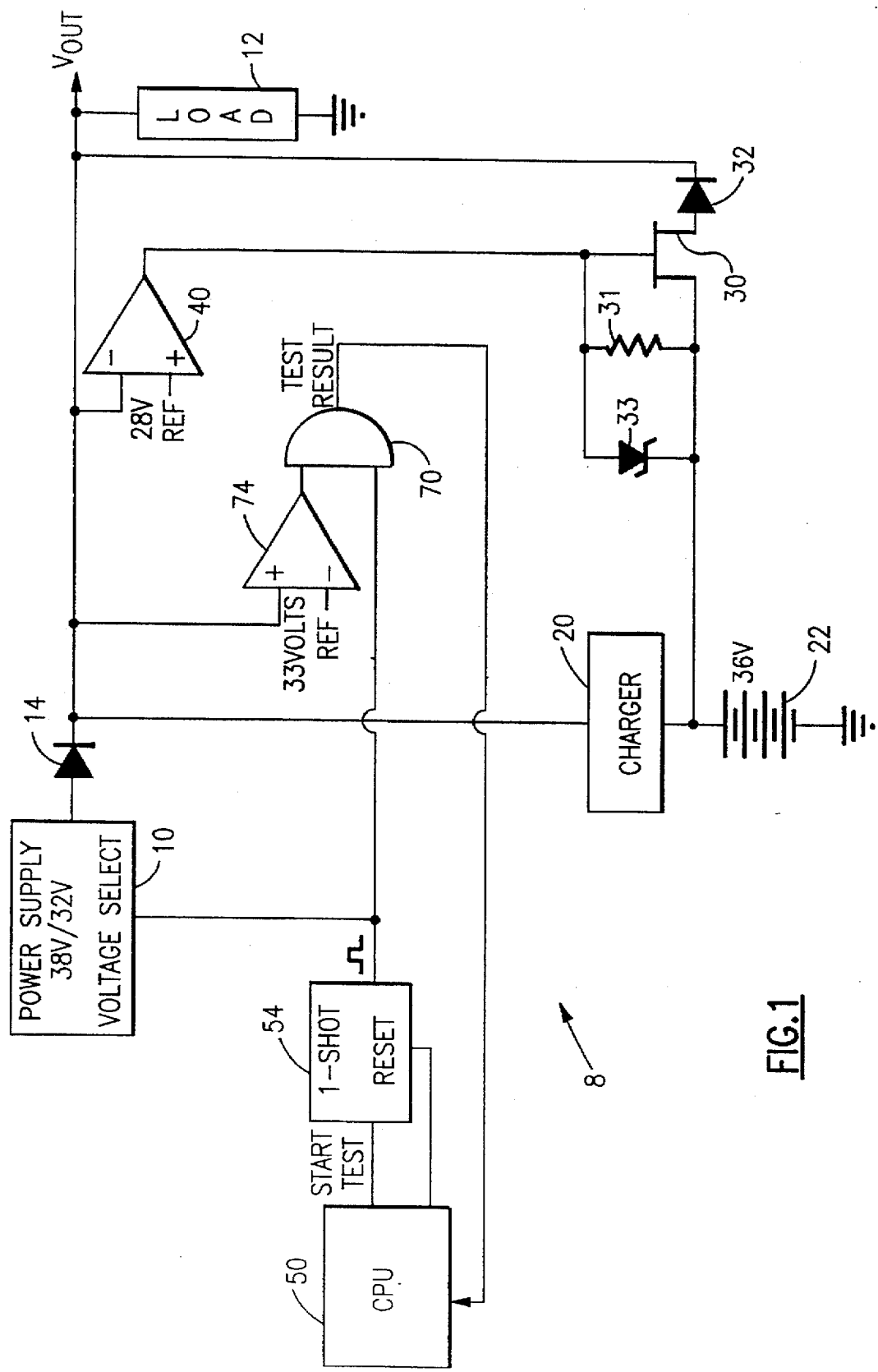
FIG. 1 is a schematic circuit diagram of a battery backup and test circuit according to the present invention.

FIG. 1 illustrates a battery backup and test circuit generally designated 8 according to the present invention. During normal operation, a main DC power source 10 supplies normal operating power to a load 12 via a diode 14. The power source 10 also drives a charger 20, via diode 14, for a back-up battery 22. By way of example, the power source 10 normally supplies 38 volts and the battery 22 normally supplies 34 volts. In this example, the load (such as a DC/DC converter) can operate satisfactorily with a minimum of 29 volts.

Normally, another N-channel FET switch 30, connected to the back-up battery, is active (due to a low voltage at its gate). A bleeder resistor 31 and a protection zener diode 33 are also included for FET 30. A diode 32 is connected between switch 30 and the load; however, during normal operation, the diode 32 is reversed biased because the load is supplied with approximately 37 volts from the main DC power source 10 (considering a one volt drop across diode 14) and the battery is charged to/rated at only 36 volts. If the main power source 10 fails such that the output voltage (Vout) drops below 35 volts, then diode 32 becomes forward biased and the battery 22 supplies the load with approximately 35 volts (the 36 volt battery voltage minus the one volt drop across switch 30 and diode 32). This is the normal battery back-up process.

The following describes the circuitry to test the battery 22. Periodically or when requested by an operator, a start test signal is developed. In the illustrated embodiment, a CPU 50 initiates the start test signal based on an internal time of day clock (not shown). The start test signal triggers a one-shot 54 which then outputs a positive pulse of predetermined duration, for example, 30 seconds. This pulse signals the power source 10 to reduce its output voltage to 32 volts. As a result of the reduced output voltage from power supply 10, diode 32 becomes forward biased and the battery 22 supplies the load with approximately 35 volts (the 36 volt battery voltage minus the one volt drop across switch 30 and diode 32) as described above. If the output voltage remains above 33 volts for the duration of the one-shot pulse, then a comparator 74 maintains a logic one level to AND gate 70 for the duration of the one-shot, and the output of the AND gate 70 indicates a favorable test result to the CPU. In this case of a successful test, after the duration of the one-shot, the power supply 10 again outputs 38 volts to the load and reverse biases the diode 32. However, if the output voltage drops below 33 volts during the duration of the one-shot pulse, then comparator 74 supplies a logic zero to AND gate 70 and the output of the AND gate 70 indicates a test failure. In response, CPU 50 resets the one shot 54 to a logic zero which causes power supply 10 to again output 38 volts. The CPU also notifies an operator to check the battery manually and replace if necessary. It should be noted that during the test mode, the power supply 10 is always available to provide sufficient operating voltage, for example 31 volts, to the load if the battery fails the test. Also, the power supply 10 quickly returns to the rated 38 volts, and no dummy load was required.

FIG. 1 also illustrates a comparator 40 which is biased at its inverting input by 28 volts and senses the load voltage at its noninverting input. When the load voltage falls below 28 volts, due to a failure of power supply 10 and discharge of battery 22, comparator shuts off switch 30. This prevents further, deep discharge of battery 22 which could harm the battery.

Figure 2:
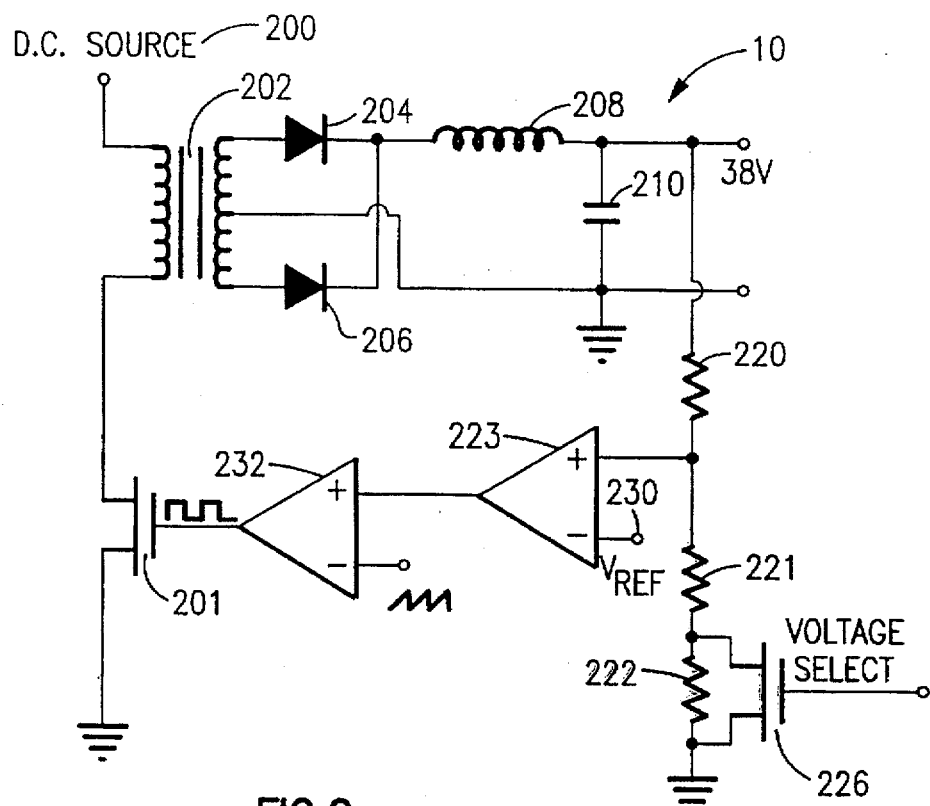
FIG. 2 is a schematic circuit diagram of one example of a main power source of FIG. 1.

FIG. 2 illustrates the two level output power supply 10 in more detail. Power supply 10 operates from a DC source 200 (which can be a full wave rectified AC signal). The DC source is applied to a primary of a transformer 202 and "chopped" by a switch 201. The amount of power delivered into the transformer 202 depends on the duty cycle of switch 201 as described below. Diodes 204 and 206 rectify the output from the secondary of the transformer 202. The rectified output is filtered by series inductor 208 and parallel capacitor 210 to provide the load voltage.

The output of power supply 10 is fed back to the noninverting input of an amplifier 223 via a voltage divider comprising resistors 222–224 and a switch 226. The output of amplifier 223, called an "error voltage", is the difference between the feedback voltage and a reference voltage 230. The reference voltage 330 exponentially rises to a fixed level to provide a "soft start". This error voltage is then supplied to another amplifier 232 whose other input is supplied by a sawtooth waveform. The result is a sequence of pulses which controls the duty cycle of switch 201. As noted above, the duty cycle of switch 201 controls the power into transformer 202 and therefore the load voltage.

During normal operation, i.e. when power supply 10 is expected to deliver 38 volts, FET 226 is activated to short circuit resistor 222. This affects the error voltage and the duty cycle of switch 201 to deliver sufficient power into transformer 202 to yield a 38 volt output. However, during the test mode, FET 226 is de-activated to connect resistor 222 in series with resistors 221. This affects the error voltage and the duty cycle of switch 201 to deliver lesser power into transformer 202 to yield the 32 volt output required for the test.

Figure 3:
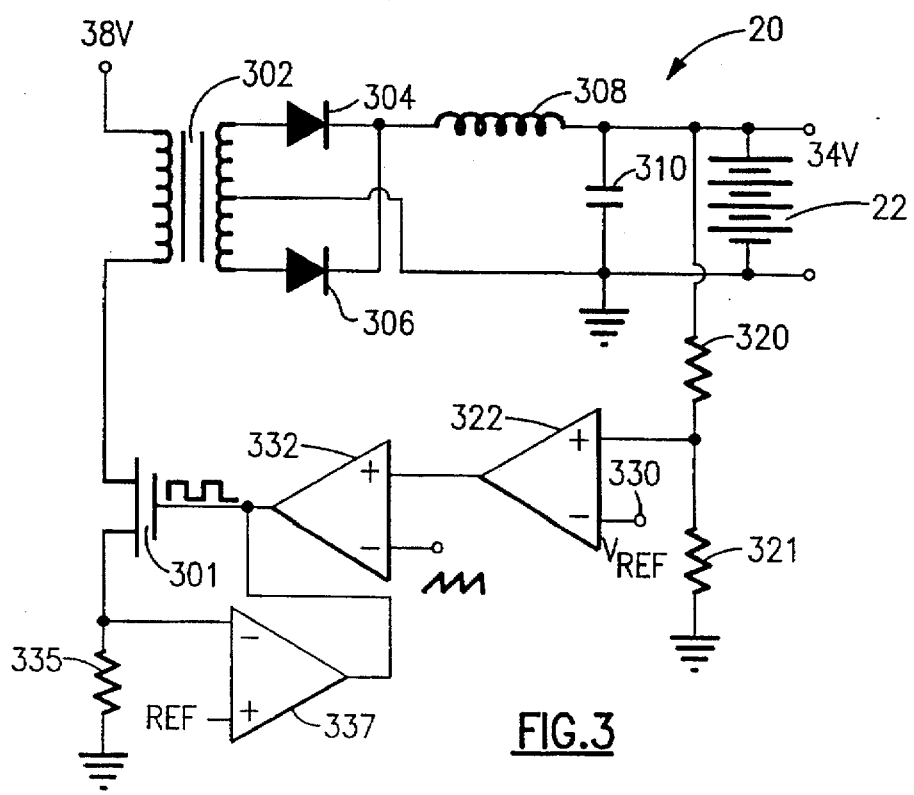
FIG. 3 is a detailed circuit diagram of one example of a battery charger of FIG. 1.

FIG. 3 illustrates the battery charger 20 in more detail. Battery charger 20 operates from the 38 volt DC supply 10. The 38 volt DC source is applied to a primary of a transformer 302 and "chopped" by a switch 301. The amount of power delivered into the transformer 302 depends on the duty cycle of switch 301 as described below. Diodes 304 and 306 rectify the output from the secondary of the transformer 302. The rectified output is filtered by series inductor 308 and parallel capacitor 310 to provide the load voltage.

The output of battery charger 20 is fed back to the noninverting input of an amplifier 322 via a voltage divider comprising resistors 320 and 321. The output of amplifier 322, called an "error voltage", is the difference between the feedback voltage and a reference voltage 330. The reference voltage 330 exponentially rises to a fixed level to provide a "soft start". This error voltage is then supplied to another open collector comparator 332 whose other input is supplied by a sawtooth waveform. The result is a sequence of pulses which controls the duty cycle of switch 301. As noted above, the duty cycle of switch 301 controls the power into transformer 302 and therefore the load voltage. FIG. 3 also illustrates a conventional control comprising a resistor 335 and an open collector comparator 337 to limit current delivered to the battery 22. The comparator compares a voltage proportional to the current through the primary of transformer 302 to a fixed reference, and when the proportional voltage is higher, shuts off switch 301.

Figure 4:
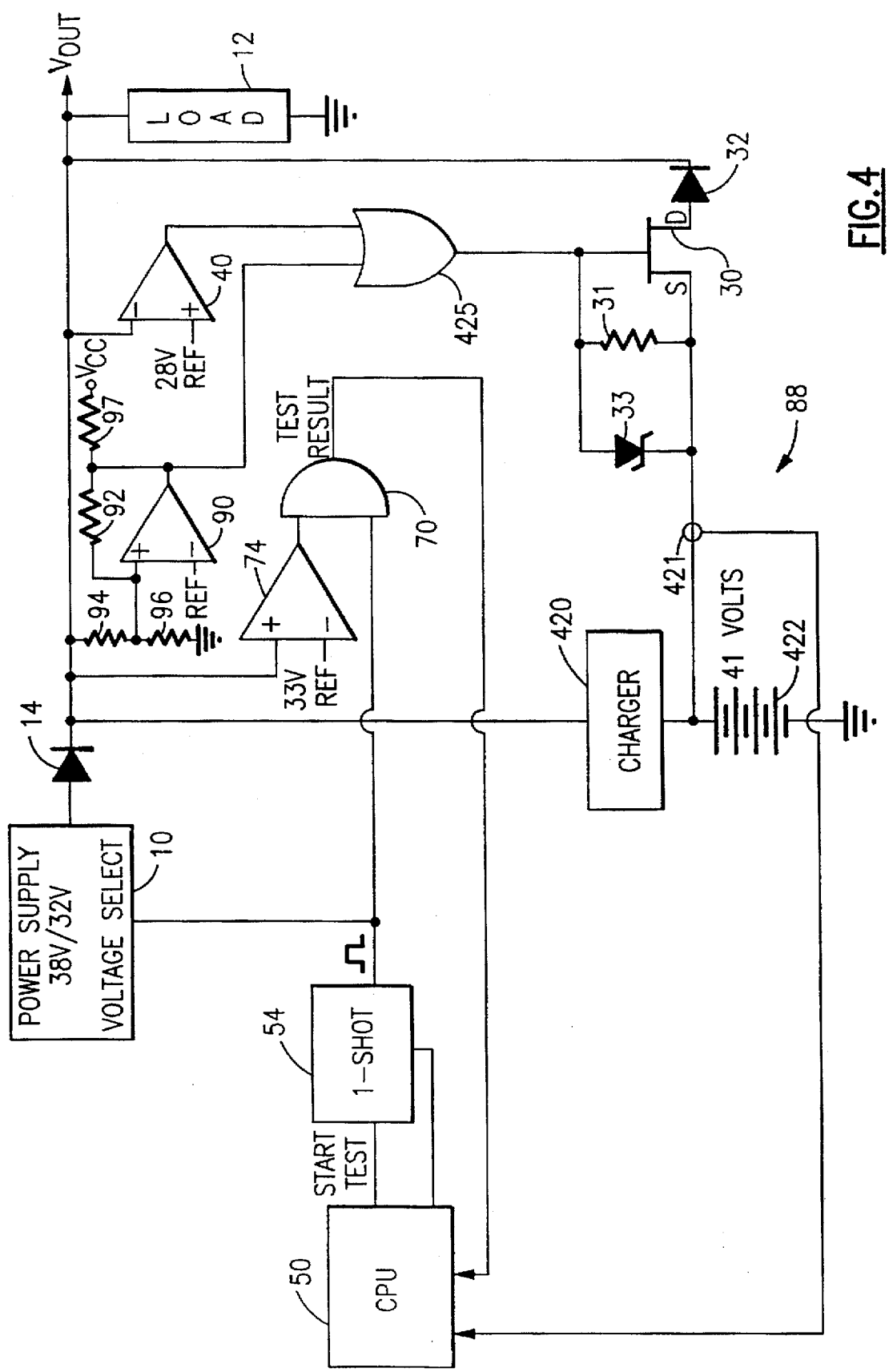
FIG. 4 is a circuit diagram of an alternate battery backup and test circuit according to the present invention.

FIG. 4 illustrates an alternate battery backup and test circuit generally designated 88 according to the present invention. Battery backup and test circuit 88 includes all the components of battery backup and test circuit 8 except battery charger 420 and battery 422 substitute for battery charger 20 and battery 22, respectively, and additional components as follows. Before describing the additional components in detail, it should be noted that battery 422 is charged to 41 volts which is greater than the 38 volt normal rated voltage of power supply 10. The higher charge voltage of the battery permits a greater operating time from the battery in the event of failure of the main power supply 10. However, because of the greater (initial) charge voltage of the battery, an additional control for switch 30 to prevent delivery of current from the battery to the load during normal operating conditions.

The components of battery backup and test circuit 8 included in battery backup and test circuit 88 operate in the same manner as described above and this need not be repeated. The additional components of battery backup and test circuit 88 include an open collector comparator 90 which exhibits hysteresis due to a feedback resistor 92 and controls switch 30 as follows. A fraction of the load voltage (determined by voltage dividing resistors 94 and 96) is applied to the noninverting input of comparator 90. A reference voltage is connected to the inverting input. During start-up, the load voltage is zero volts so the fraction is less than the reference voltage and comparator 90 outputs a low level into OR gate 425. However, the load voltage is also less than the 28 volt reference into comparator 40 so compartor 40 outputs a high level into OR gate 425. This opens N-channel FET 30 to prevent delivery of power from the battery to the load until the load exceeds 28 volts. This also causes the feedback resistor 92 to act in parallel with resistor 96 to ground. Consequently, when the load voltage rises after start-up, the voltage into the noninverting input will also rise but not as fast as if the comparator 90 were outputting a high level. Therefore, the voltage at the noninverting input will not exceed the reference voltage until power supply 10 develops a relatively high load voltage, for example, 36 volts. At that time, comparator 90 will output a high level to keep switch open (even though comparator 40 will output a low level); no current is required from battery 422. Once comparator 90 exhibits a high level output, +Vcc at the output of comparator 90 then adds to the voltage at the noninverting input via a resistor 97 and feedback resistor 92. Consequently, if the load voltage subsequently falls due to failure of power supply 10 or a test mode, comparator 90 will not output a low level until the load voltage drops to a relatively low level, for example, 33 volts. The low level output from comparator 90 in conjunction with a low level output from comparator 40 will close switch 30 to permit battery 422 to deliver current to the load. The low level output from comparator 90 will also cause resistor 92 to act in parallel with resistor 96 to ground. This will raise the switching threshold back to 36 volts. When the power supply voltage subsequently rises to 37 volts, comparator 90 will again output a high level which opens switch 30. Thus, the battery is connected to the load during the critical time when the power supply voltage drops below 33 volts, and the hysteresis stabilizes operation. (Comparator 40 also shuts off switch 30 when the load voltage drops below 28 volts to prevent deep discharge of the battery.)

Figure 5:
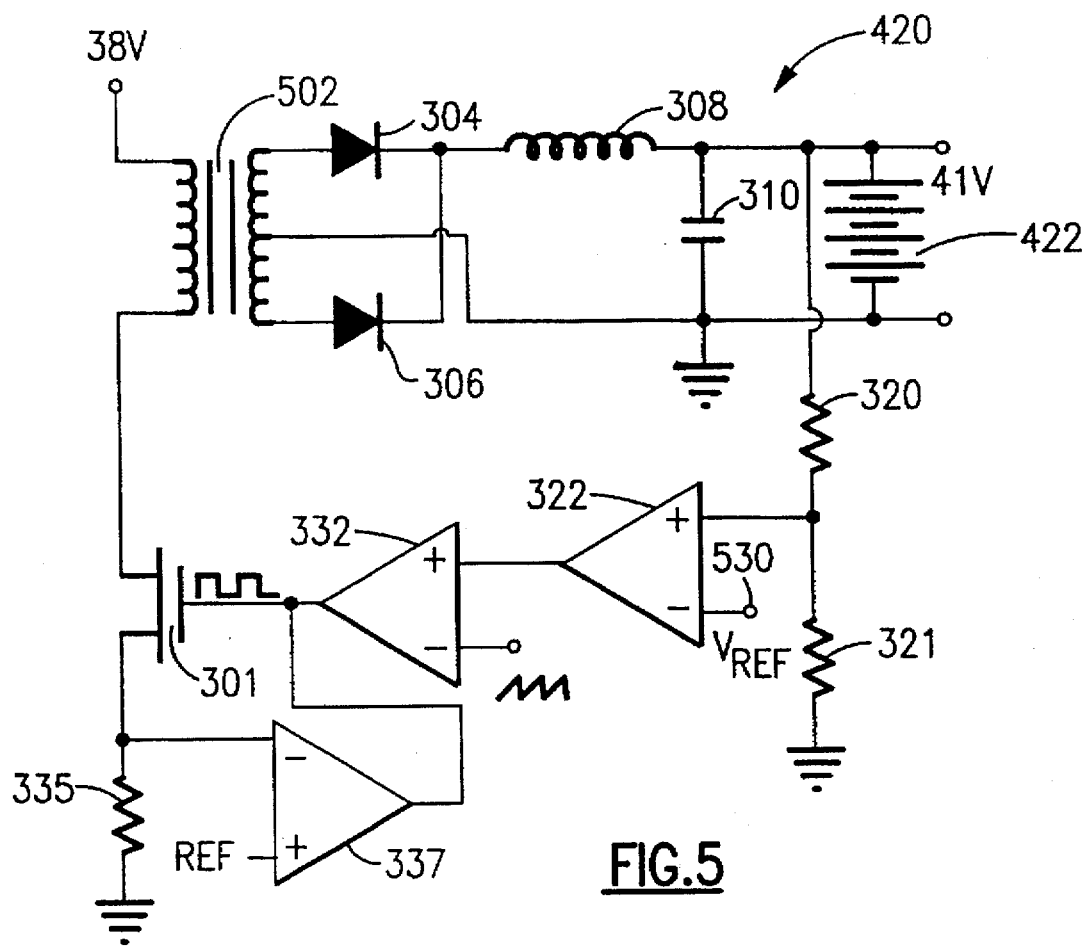
FIG. 5 is a detailed circuit diagram of one example of a battery charger of FIG. 4.

FIG. 5 illustrates the battery charger 420 used in the circuit of FIG. 4. Battery charger 420 is identical to battery charger 20 except that battery charger 420 has a transformer 502 with a turns ratio and a scaled reference voltage 530 to yield a 41 volt output to charge battery 422.

Based on the foregoing, backup battery and test circuits according to the present invention have been disclosed. However, numerous modifications and substitutions can be made without deviating from the scope of the present invention. For example, power sources and back-up batteries with other voltage levels can be used provided that the main power source voltage is normally greater than the battery back-up voltage. It is also possible to utilize comparator 90 without the feedback resistor 92, i.e. without hysteresis. It is also possible during the battery test to monitor the current output from the battery using a Hall current sense circuit 421. In this case the evaluation of the battery is based on the current and voltage performance together. Therefore, the present invention has been described by way of illustration and not limitation and reference should be made to the following claims to determine the scope of the present invention.

We claim:

1. Apparatus for supplying power to a load and testing a backup battery, said apparatus comprising:

a main power source coupled to a load to deliver power at a normal rated voltage during normal operation, and at a lower, test mode voltage if required during a test mode;

means, during a battery test interval, for lowering an output voltage of said main power source to said test mode voltage and attempting to supply said load from said battery, said main power source at said test mode voltage being sufficient to drive the load if said battery fails during said battery test interval.

2. Apparatus as set forth in claim 1 wherein a maximum voltage of said battery is greater than said normal rated voltage of said main power source.

3. Apparatus as set forth in claim 1 wherein the attempting means comprises a diode interposed between said battery and said load and oriented to pass current from said battery to said load during said test mode.

4. Apparatus as set forth in claim 3 further comprising a diode interposed between said main power source and said load and oriented to supply power from said main power source to said load when said main power source outputs said normal rated voltage to said load.

5. Apparatus as set forth in claim 4 wherein the diode interposed between said main power source and said load is reversed biased when said main power source outputs said lower test mode voltage and said battery outputs rated voltage during said test mode.

6. Apparatus as set forth in claim 1 wherein the attempting means comprises:

a switch connected between the battery and said load; and a comparator having a first input coupled to sense the load voltage, a second input coupled to a reference voltage and an output coupled to control said switch such that when said load voltage falls below a predetermined level, said comparator activates said switch and said battery delivers current to said load via said switch.

7. Apparatus as set forth in claim 6 wherein said comparator includes hysteresis such that said comparator deactivates said switch at a higher voltage than said comparator activates said switch.

8. Apparatus as set forth in claim 7 further comprising means for signalling said main power source to return to said normal rated voltage during said test mode interval if said battery fails to supply sufficient power to said load.

9. A method for testing a battery which backs-up a main power source, said method comprising the steps of:

delivering power from the main power source to said load at a normal rated voltage during normal operation; and during a test mode, lowering an output voltage of said main power source and attempting to supply said load from said battery, said main power source at said test mode voltage being coupled and sufficient to drive the load if said battery fails during said test mode.

10. A method as set forth in claim 9 further comprising the steps of:

sensing a voltage of said load; and activating a switch connected between said battery and said load to cause said battery to deliver power to the load via said switch when said load voltage falls below a predetermined level during said test mode and when said main power source fails.

11. A method as set forth in claim 9 further comprising the step of supplying said load from said main power source at said test mode voltage when said battery initially fails to supply sufficient voltage to said load during said test mode and, in response to the failure, increasing said voltage of said main power supply to said normal rated voltage.

12. A test circuit for a battery which backs-up a main power source, said circuit comprising:

an output port for connection to a load;

an input port for connection to a main power source and coupling to said output port;

a battery connection port coupled to said output port such that said battery is coupled to the load if said main power source drops below a predetermined level; and means, during a battery test interval, for signalling said main power source to lower an output voltage of said main power source to or below said predetermined level but sufficient to drive the load if said battery fails during said battery test interval.

13. A circuit as set forth in claim 12 further comprising a diode connected between said battery connection port and said output port, said diode being reversed biased when said main power source supplies rated voltage to said load.

14. A circuit as set forth in claim 13 wherein said diode becomes forward biased when said main power source outputs the lower voltage level.

15. A circuit as set forth in claim 13 further comprising:

a switch connected in series with said diode between said battery connection port and said output port; and means for shutting off said switch if the output voltage drops below another predetermined voltage level less than the first said predetermined voltage level.

16. A circuit as set forth in claim 12 further comprising means for supplying said load from said main power source at the lower voltage when said battery first fails to supply sufficient voltage to said load and, responsive to the failure, increasing said voltage of said main power supply to said normal rated voltage.

17. A circuit as set forth in claim 11 further comprising:

a first diode connected between said main power source and said output port and being forward biased when said power supply outputs rated voltage; and a second diode connected between said battery connection port and said output port and being reversed biased when said main power source outputs rated voltage.

18. A circuit as set forth in claim 12 further comprising:

a switch connected between the battery connection port and said output port; and a comparator having a first input coupled to sense the load voltage, a second input coupled to a reference voltage and an output coupled to control said switch such that when said load voltage falls below said predetermined level, said comparator activates said switch and said battery delivers current to said load via said switch.

19. A circuit as set forth in claim 18 wherein said comparator includes hysteresis such that said comparator deactivates said switch at a higher voltage than said comparator activates said switch.

20. A circuit as set forth in claim 18 further comprising means for boosting the control voltage of said switch when said comparator activates said switch.

* * * * *